United States Patent [19]
Yang et al.

[11] Patent Number: 5,900,290
[45] Date of Patent: May 4, 1999

[54] METHOD OF MAKING LOW-K FLUORINATED AMORPHOUS CARBON DIELECTRIC

[75] Inventors: Hongning Yang; Tue Nguyen, both of Vancouver, Wash.

[73] Assignees: Sharp Microelectronics Technology, Inc., Camas, Wash.; Sharp Kabushiki Kaisha, Osaka, Japan

[21] Appl. No.: 09/023,382

[22] Filed: Feb. 13, 1998

[51] Int. Cl.⁶ .............................. B05D 3/06; C23C 16/30
[52] U.S. Cl. .......................... 427/577; 427/573; 427/99
[58] Field of Search ................................. 427/577, 573, 427/570, 372.2, 99, 255.2

[56] References Cited

FOREIGN PATENT DOCUMENTS 62-180073  8/1987  Japan .

OTHER PUBLICATIONS

Paper titled, "Diamondlike Carbon Materials as Low–k Dielectrics for Multilevel Interconnects in ULSI" by A. Grill, A. Patel, K.L. Saenger, C. Jahnes, S.A. Cohen, A.G. Schrott, D.C. Edelstein and J.R. Paraszczak, pulished in Mat. Res. Soc. Symp. Proc. vol. 443, 1997 Materials Research Society, pp. 155–164.

Paper titled, "Two Approaches to the Development of Los K Systems; Parylene AF–4, and Fluorinated Amorphous Carbon" by A. Harrus, J. Kelly, D. Kumar, T. Mountsier and M.A. Plano presented at 52$^{nd}$ Semiconductor Symposium of the Japaneses ECS, pp. 76–81.

Paper titled, Fluorocarbon Films from Plasma Polymerization of Hexafluoropropylene and Hydrogen, by T.W. Mountsier and D. Kumar, published in Mat. Res. Soc. Symp. Proc. vol. 443, 1997 Materials Research Society, pp. 41–46.

Paper titled, "Ultra Low k Dielectric PECVD α–FC Films for Damascene Application" by S. Robles, P. Xu, W–F. Yau, J. Huang and K. Fairbairn presented at Advanced Metallization and Interconnect Systems for ULSI Systems Conf., Sep. 1997. No Page Number !.

Paper titled, "Fluorinated Amorphous Carbon Thin Films Grown from $C_4F_8$ for Multilevel Interconnections of Integrated Circuits" by K. Endo, T. Tatsumi, Y. Matsubara and T. Horiuchi published in Mat. Res. Soc. Symp. Proc. vol. 443, 1997 Materials Research Society, pp. 165–170.

Article titled, Low–Dielectric–Constant Materials for ULSI Interlayer–Dielectric Applications by W. W. Lee and P.S. Ho, published in MRS Bulletin/Oct. 1997, pp. 19–23.

*Primary Examiner*—Roy V. King
*Attorney, Agent, or Firm*—David C. Ripma; Gerald Maliszewski

[57] ABSTRACT

The invention provides a process for depositing fluorinated amorphous carbon (a-F:C) films on IC wafers to provide a low-k interconnect dielectric material. The process, carried out in a PECVD chamber, introduces silane gas ($SiH_4$) into the mixture of $C_4F_8$ and $CH_4$ gases used to deposit a-F:C films. The silane helps to decrease the fluorine etchants in the deposited film, helping to improve the crosslinks in the deposited product. Film produced in accordance with the present invention has both low-k, generally below 2.4, and high thermal stability, generally above 440° C., allowing for higher thermal anneal temperatures.

20 Claims, 2 Drawing Sheets

METHOD OF MAKING LOW-K FLUORINATED AMORPHOUS CARBON DIELECTRIC

BACKGROUND AND SUMMARY OF THE INVENTION

The invention relates to a method of forming an interlevel dielectric of the type used in interconnect structures of integrated circuits, and more paticularly to a plasma enhanced chemical vapor deposition method of forming a low-dielectric-constant insulating material.

The designers and makers of large scale integrated circuits continue to make ever-smaller devices which allow for greater speed and increased device packing densities. Sizes of individual features (e.g., the transistor gate length) on ultra-large-scale-integration (ULSI) circuits is shrinking to less than 0.25 microns ($\mu$m). The resultant increase in packing densities on a semiconductor chip, and the associated increase in functionality, has greatly increased the number and density of interconnects on each chip.

Smaller on-chip devices, packed closer together, with increased functionality and complexity, require interconnects (lines, vias, etc.) which are smaller, more complex (e.g., more wiring levels), and more closely-spaced. The smaller sizes of the interconnects, which increases resistance, and closer interconnect spacing, leads to RC (resistance-capacitance) coupling problems including propagation delays and cross talk noise between interlevel and intralevel conductors. As interconnect lines, both interlevel and intralevel, become smaller and more closely spaced RC, delays become an increasing part of total signal delays, offsetting any speed advantage derived from smaller device size. RC delays thus limit improvement in device performance. Small conductor size increases the resistivity (R) of metal lines and smaller interline and interlevel spacing increases the capacitance (C) between lines. Use and development of lower-resistivity metals such as copper will continue to reduce the resistivity of interconnect lines. Capacitance can be reduced by employing lower dielectric constant (i.e., lower-k) dielectric materials.

Since capacitance (C) is directly proportional to the dielectric constant (k) of the interconnect dielectric, RC problems presented by ULSI circuits can be reduced if a low-dielectric-constant (low-k) material is used as the insulating material disposed between and around the interlevel and intralevel conductors (the dielectric being referred to herein as the "interconnect dielectric" or "interconnect dielectric material"). What the industry is seeking is a suitable replacement for silicon dioxide ($SiO_2$), which has long been used as a dielectric in integrated circuits. Silicon dioxide has excellent thermal stability and relatively good dielectric properties, having a dielectric constant of around 4.0. But there is now a need for an interconnect dielectric material which is suitable for use in IC circuit interconnects and which has a lower dielectric constant than $SiO_2$.

After a long search for possible low dielectric constant materials to be used as an interconnect dielectric in ULSI circuits, the candidates have now been narrowed down to a few, depending upon application. One of the promising materials, which has been actively studied recently and received considerable attention, is fluorinated amorphous carbon (a-F:C).

Fluorocarbon polymers have been studied for more than two decades and most of their applications is for the use of coating materials to protect plastics, fibers, and metals. It is known that a-F:C films can be fabricated using plasma enhanced CVD ("PECVD"). Early experience with a-F:C showed that the films deposited at room temperature could be deposited with a dielectric constant as low as 2.1 and a thermal stability <300° C. Further experimentation showed that if the a-F:C films were deposited at higher substrate temperatures, the thermal stability could be improved up to 400° C., but the dielectric constant increased above ~2.5.

Table I illustrates how the dielectric constants and thermal stabilities of several members of carbon family compare to a-F:C. It shows that the dielectric constant can be lowered if carbon films contain higher fluorine concentrations. In the PECVD process, the fluorine concentration of a-F:C film depends on the fluorine to carbon ratio in the discharge, which is established by the feed gas composition, RF power input, substrate temperature, and total pressure. The thermal stability is closely related to the degree of crosslinking among the polymer chains. The greater the degree of crosslinking, the more tightly bound the structures are, and the higher the thermal stability. In a PECVD process, either raising substrate temperature, enhancing ion bombardment, or applying low frequency plasma energy can increase the crosslinking in a-F:C films. Higher temperature deposition has the disadvantage of inevitably reducing the fluorine concentration, thereby increasing the dielectric constant.

TABLE I

Relevant properties for several members of carbon family

| Material | Chemical Composition | Structure | k | Thermal Stability |
|---|---|---|---|---|
| Diamond | C | Crystalline, fully crosslinked | Greater than 5 | Very high |
| Hydrogenated Carbon (a-H:C) or Diamond-like Carbon (DLC) | C & H H: 30 at. %– 50 at. % | Amorphous polymer, highly crosslinked | 2.7–3.8 | 350–400° C. |
| Fluorinated Amorphous Carbon (a-F:C) | C & F F: 40 at. %– 50 at. % | Amorphous polymer, highly crosslinked | 2.1–2.8 | 300–420° C. |
| PTFE or Teflon | C & F F: 67 at. % | ($-CF_2-$) polymer, uncrosslinked | 2.0 | <300° C. |

Compared with the processes at low deposition temperatures, the disadvantages of high temperature deposition processes are that it not only increases the dielectric constant, but also leads to poor adhesion to $SiO_2$ and $Si_3N_4$ due to increased thermal stress, and also causes higher leakage current in the films. It appears that a lower deposition temperature is desirable.

Fluorinated amorphous carbon has a dielectric constant k below 3.0 and, depending on the proportion of fluorine (F) in the film, can have a k in the range of 2.0 to 2.5. A major problem with a-F:C is its poor thermal stability. It has heretofore not been possible to prepare a-F:C films with suitable low-dielectric-constant properties (k less than 2.5), and a thermal stability above 400° C. Temperatures in the sintering range (450° C.) typical for manufacturing ULSI chips cause excessive shrinkage of the a-F:C film, probably due to fluorine volatilization. Mechanical strength and adhesion problems also are obstacles to the use of a-F:C as an interconnect dielectric in high-density integrated circuits.

It would be advantageous to have a dielectric material for use in interconnect structures of integrated circuits, alternatively referred to herein as an "interconnect dielectric" which has a low dielectric constant (k=3.0 or less) and improved thermal stability up to 450° C., thus providing a suitable lower-k replacement for silicon dioxide dielectric.

It would also be advantageous to have an a-F:C film which has a dielectric constant of 2.5 or less which is thermally stable to 450° C.

It would also be advantageous to have a method of forming a-F:C film on a silicon substrate using plasma enhanced chemical vapor deposition (PECVD) techniques for depositing low-k a-F:C dielectric material on a semiconductor substrate, wherein the resultant a-F:C is substantially stable up to 450° C.

Accordingly, a plasma enhanced chemical vapor deposition (PECVD) process is provided for depositing a dielectric material on a substrate for use in interconnect structures of integrated circuits. The method comprises steps which include positioning the substrate in a PECVD chamber and heating the substrate to a temperature above 200° C. A flow of fluorine containing gas (FCG) and carbon containing gas (CCG) is introduced into the chamber under sufficient applied energy to form a fluorine and carbon gas plasma in the chamber. The ratio of FCG to CCG is selected to deposit fluorinated amorphous carbon on the substrate. And at the same time as the flow of FCG and CCG is introduced into the chamber, a flow of silane ($SiH_4$) is introduced into the chamber. The silane increases the thermal stability of the fluorinated amorphous carbon deposited on the substrate.

The preferred fluorine containing gas (FCG) used in the process of the present invention is octafluorocyclobutane ($C_4F_8$). The preferred carbon containing gas (CCG) used in the process is methane ($CH_4$). A suitable ratio of FCG to CCG for the deposit of fluorinated amorphous carbon on the substrate is generally in the range of between 1/1 and 30/1 (FCG/CCG) and, more preferably, generally in the range of 5/1 to 15/1. The percentage of silane gas in the mixture of FCG, CCG, and silane gases introduced into the PECVD chamber is preferably generally in the range of 1% to 15%. The ambient pressure maintained in the PECVD chamber during the introduction of FCG, CCG, and silane into the chamber is preferably generally in the range of 0.3 Torr to 2.0 Torr.

During the introduction of FCG, CCG, and silane into the PECVD chamber, plasma energy, in the form of high frequency (HF) plasma energy, is supplied to ionize the gases introduced into the chamber. Simultaneously, low frequency (LF) energy is introduced into the chamber, to enhance the crosslinking in the deposited a-F:C film. The HF energy has a frequency of 13.56 MHz and is preferably applied at an energy level of between 0.5 Watts and 3.0 Watts per square centimeter of substrate surface. Simultaneously, the LF is supplied in a frequency range generally in the range of 100 KHz to 900 KHz, the low frequency energy level preferably being generally in the range of 0.5 Watts and 3.0 Watts per square centimeter of substrate surface.

The above-described process is carried out for a duration sufficient to deposit a selected thickness of fluorinated amorphous carbon on the substrate. A suitable selected thickness for the a-F:C film deposited using the present invention is generally in the range of 1,000 angstroms to 10,000 angstroms, although the invention is not limited to any specific thickness range. Upon completion of the deposition of a selected thickness of fluorinated amorphous carbon on the substrate, the substrate and deposited fluorinated amorphous carbon is annealed. The present invention allows for annealing at a temperature greater than or equal to 440° C., although the process can be used with anneals of between 300° C. and 550° C. The duration of the anneal is a matter of design choice but will generally exceed 20 minutes and can be 2 hours or more, depending on the design and performance specifications of the integrated circuits being fabricated.

DETAILED DESCRIPTION OF THE PREFERRED EMBODIMENT

The present invention provides a process for depositing fluorinated amorphous carbon (a-F:C) on a silicon wafer or other substrate. The wafer substrate, at the time the steps in the method are carried out, has been processed by well-known techniques (not shown) to produce integrated circuit (IC) features (e.g., transistors and other active and passive devices) on the wafer. The type and number of integrated circuit features on the substrate are unimportant to the process of the present invention, except that the low-k fluorinated amorphous carbon dielectric material is most advantageously employed on ultra-large-scale-integration (ULSI) high-density ICs. The dielectric material is used in interconnect structures, such as conductive lines and vias (not shown) which are well-known conductive interconnect features typically formed in, and extend through, the interconnect dielectric film which is deposited on the wafer, including the a-F:C dielectric deposited in the method of the present invention. The form, architecture, and conductive materials used in the interconnect structures, as well as the methods of forming such structures, are not described herein and are a matter of design choice well known to those skilled in the art. This invention relates to the method of forming a suitable low-dielectric-constant (low-k) dielectric film which is deposited on the wafer and is suitable for use between and around the conductive lines, vias, and other conductors in ULSI and similar ICs.

Figure 1:
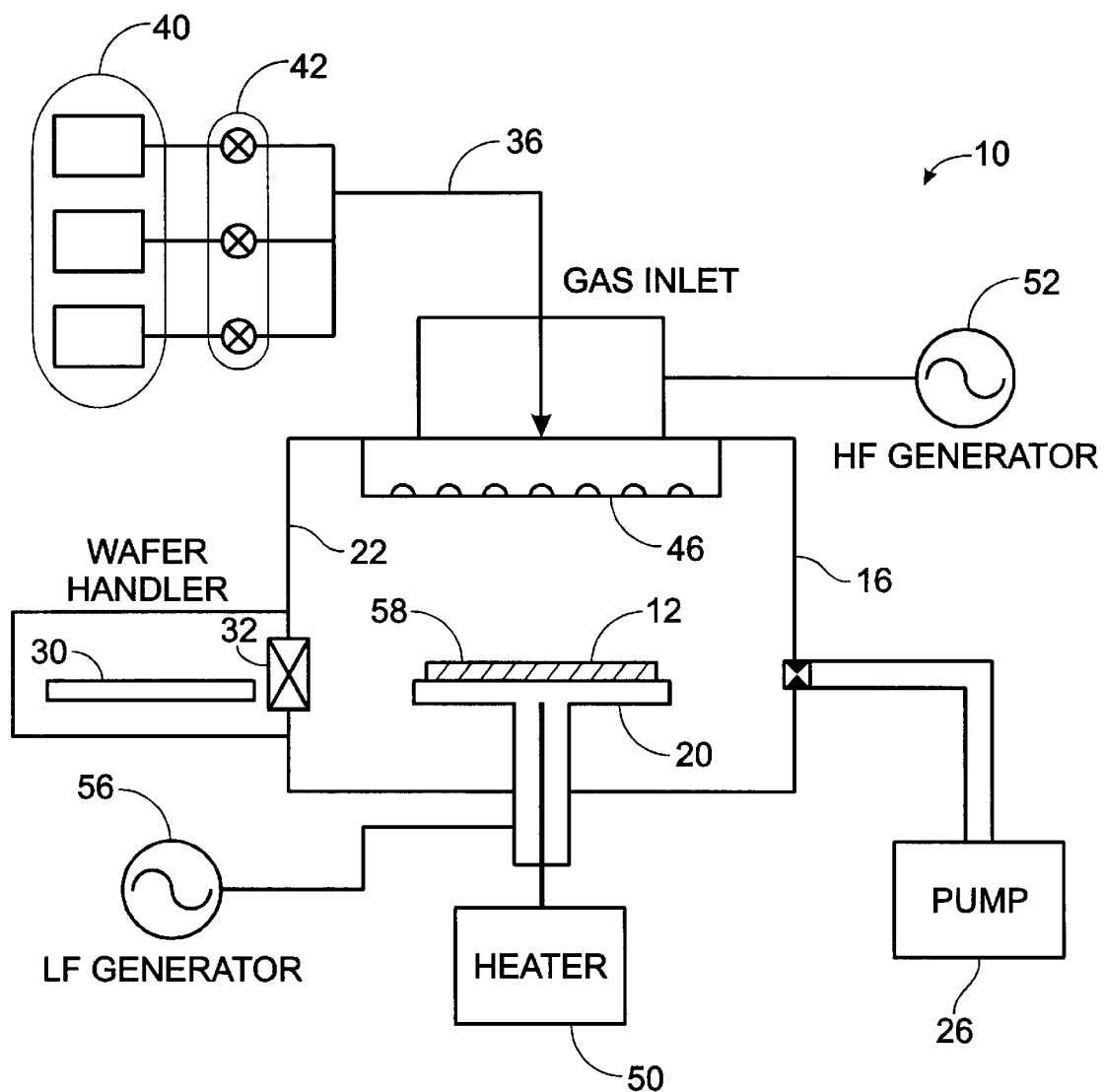
FIG. 1 is a schematic depiction of a PECVD chamber for carrying out selected steps in the process of the present invention.

FIG. 1 is a schematic illustration of a suitable apparatus 10 for carrying out a plasma enhanced chemical vapor deposition (PECVD) on a substrate such as wafer 12. Apparatus 10 includes a PECVD chamber 16 of a size suitable for holding one or more wafers 12, which are supported in the chamber on a chuck 20. As is typical of such chambers, the interior 22 can be evacuated or pressurized as desired by a suitable pump and valve apparatus schematically illustrated in FIG. 1 by pump 26. Individual wafers 12 are moved in and out of chamber 16 by a suitable wafer handler 30 through a gate valve 32 in the chamber wall, allowing wafers to be moved onto chuck 20 for processing, and then removed from the chamber.

Selected gases used in PECVD processing are introduced into the chamber through a suitable manifold system 36 from various gas supply reservoirs indicated collectively at 40, controlled by valves 42. The gases are introduced into the chamber through what is called a shower head 46, which distributes the gases as required. Chuck 20 can be heated to any desired temperature, the heating element for this purpose being schematically depicted as heater 50. The heater and chuck are used to select the temperature of wafer 12 during PECVD processing.

Plasma energy is supplied to the chamber through an RF generator 52 which supplies high frequency (HF) RF power radiated through shower head 46. The industry standard for HF plasma energy use in PECVD chambers is 13.56 megahertz (MHz), although the invention is not limited to any exact high frequency value. Apparatus 10 preferably also includes a low frequency (LF) generator 56 for supplying LF power to the interior of the chamber. LF power is applied between the chuck 20 and shower head 46 in a manner well known to those skilled in the art. LF power is used to increase crosslinking in the amorphous fluorinated carbon (a-F:C) film deposited on wafer 12 during PECVD processing.

Figure 2:
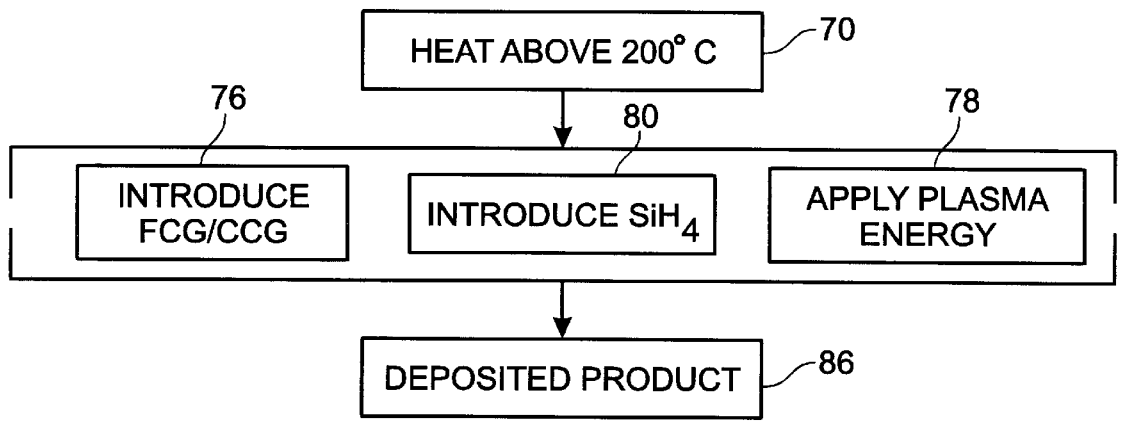
FIG. 2 is a block diagram illustrating the steps in the process for depositing fluorinated amorphous carbon on a substrate in a PECVD chamber as shown in the FIG. 1, in accordance with the present invention.

FIG. 2 illustrates the steps in the process of the present invention, which will be described with reference to FIGS. 1 and 2. A wafer substrate 12 is first positioned on chuck 20 in PECVD chamber 16 by wafer handler 30. The substrate 12 is typically a silicon wafer prepared for receiving a-F:C, the a-F:C being deposited on the upper surface 58 of the wafer. The first step shown in FIG. 2 is step 70, which is the heating of substrate 12 to a temperature above 200° C. Preferably, wafer 12 is heated to a temperature generally in the range of 200° C. –300° C.

The next step 76 is the introduction of a flow of fluorine containing gas (FCG) and carbon containing gas (CCG) into chamber 16 via manifold 36 from suitable supplies 40. In the process of the present invention, the preferred FCG is octafluorocyclobutane ($C_4F_8$) and the preferred CCG is methane ($CH_4$). The ratio of FCG/CCG introduced into chamber 16 is selected to deposit a-F:C on substrate 12 by plasma enhanced chemical vapor deposition. The suggested ratio is between 1/1 and 30/1 (FCG/CCG) and, preferably, between 5/1 and 15/1. During step 76 suitable plasma power is applied in chamber 16 (step 78). In the present invention, suitable plasma power includes HF energy (13.56 MHz), at an energy level of between 0.5 Watts and 3.0 Watts per square centimeter of substrate surface (i.e., the surface area of substrate 12), and LF energy, at a frequency generally in the range of 100 KHz 900 KHz, at an energy level of 0.5 Watts and 3.0 Watts per square centimeter of substrate surface.

As is known to those skilled of PECVD processing, the plasma energy in chamber 16 ionizes the introduced gases, generating polymer radicals which are deposited on surface 58 of wafer 12. $C_4F_8$ provides discharge of two kinds of long-life radicals. One is the fluorocarbon radical ($CF_x$) (wherein $1 \leq x \leq 2$), which is the building block for a-F:C deposits. The other is F and $F_2$ atoms, which are destructive etchants that form volatile fluorides which weaken the a-F:C film deposited on substrate 12. The methane serves to discharge hydrogen (H) radicals, which can tie up F atoms by forming volatile HF, which reduces the etching from the F and $F_2$ atoms, thus improving the stability of the resultant a-F:C film deposited on the wafer. The deposition rate and the fluorine concentration of the a-F:C film are selectively controlled by the flow rates of the FCG and CCG gases, as well as the chamber pressure within chamber 16. As noted above, the ratio of FCG to CCG is generally between 1 to 1 and 30 to 1 and is preferably between 5 to 1 and 15 to 1 (FCG to CCG). The ambient pressure maintained within chamber 16 during steps 76 and 78 is preferably generally in the range of 0.3 Torr to 2.0 Torr.

The present invention further includes the additional step 80 of introducing silane ($SiH_4$) gas into chamber 16, together with the FCG and CCG gases, during steps 76 and 78. The percentage of silane introduced into chamber 16 during step 80 is preferably generally in the range of 1% to 15% of the total introduced gases (i.e., FCG and CCG and silane). The silane has been found to improve the thermal stability of the deposited a-F:C film.

The reactions in the PECVD chamber are summarized as follows:

PLASMA POLYMERIZATION CHEMISTRY

Precursor: $C_4F_8+CH_4$
Free radicals produced by plasma discharge:

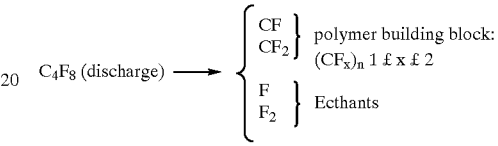

Adding $CH_4 \rightarrow$ suppressing fluorine etching to $(CF_x)_n$ deposits:

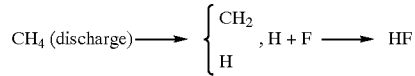

Adding $SiH_4 \rightarrow$ suppressing fluorine etching to $(CF_x)_n$ deposits:

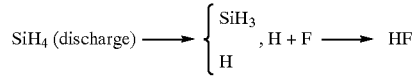

The amorphous fluorinated carbon deposited on wafer 12, which is the product 86 of the present invention, has been found to have a lower dielectric constant and greater thermal stability than a-F:C films deposited without the use of silane gas. Thermal stability is generally defined as minimal-to-zero shrinkage (e.g., less than 1% shrinkage) of the deposited a-F:C film during the high temperature anneal which is carried out upon completion of the interlevel interconnects on an IC wafer. It is advantageous in IC wafer fabrication to be able to anneal the fabricated wafer at a temperature above 440° C. for a minimum of approximately 20 minutes, and preferably between 30 minutes and up to several hours. The anneal is generally a part of the completion process for the devices on the wafer. One significant problem with the use of a-F:C dielectrics on IC wafers has been its poor thermal stability during anneals over 350° C.–400° C. Fluorinated amorphous carbon films deposited using prior art processes, when subjected to higher temperature anneals (440° C.+), exhibit undesirable shrinkage, for example, 5%–20% or more. Prior art PECVD amorphous fluorinated carbon deposition processes, which do not use silane, have been able to improve the thermal stability of the deposited film slightly (allowing for a final anneal temperature of up to 405° C. to 425° C.), with acceptable shrinkage, by reducing the fluorine content of the film. But lower F levels in the film tends to increase the dielectric constant (k) to perhaps k=2.6+.

The present invention is able to provide a-F:C films with good thermal stability (minimal or zero shrinkage at final anneals up to 440° C.–465° C.) with low k (k=2.25 to 2.5). Greatly improved thermal stability is provided over a wider range of anneal temperatures, for example, between 300° C.–550° C. The benefit of introducing silane gas into the PECVD chamber during a-F:C deposition is believed to help in the reduction of fluorine radicals by providing additional H radicals for combining with the F and $F_2$ etchants in the chamber, as summarized by the final set of reactions shown above under the heading "PLASMA POLYMERIZATION CHEMISTRY." By whatever process, experiments with the introduction of silane in the percentages specified above does improve the thermal stability and reduce the dielectric constant of the resultant a-F:C film.

Figure 3:
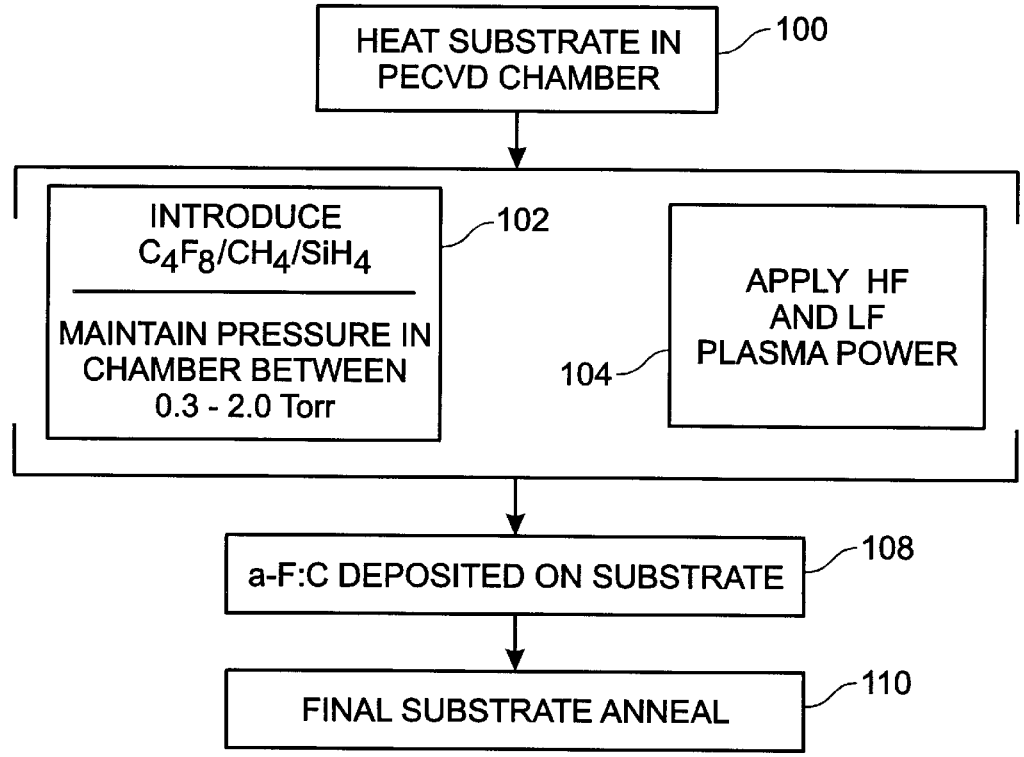
FIG. 3 is a block diagram illustrating a preferred embodiment of a process for depositing fluorinated amorphous carbon on a substrate in a PECVD chamber, carrying the process through to a final anneal.

FIG. 3 shows an illustrative embodiment the process of the present invention, explaining the process in greater detail. Referring to FIGS. 1 and 3, in step 100 the wafer 12 is positioned on chuck 20 in chamber 16 and heated to a temperature generally in the range of 200° C. to 300° C. In step 102, gases $C_4F_8$, $CH_4$, and $SiH_4$ are introduced into chamber 16 via supplies 40 and valves 42 and manifold 36. The gases are distributed in chamber 16 through showerhead 46. The flow rates of gases during step 102 are the rates required to maintain the ambient pressure within chamber 16 generally in the range of 0.3 Torr and 2.0 Torr. The ratio of $C_4F_8$ to $CH_4$ ($C_4F_8/CH_4$) during step 102 is generally in the range of 1/1 to 30/1 and preferably between 5/1 and 15/1. The percentage of silane gas introduced in step 102, as a percentage of the three introduced gases $C_4F_8$, $CH_4$, and $SiH_4$, is generally in the range of 1% to 15% $SiH_4$.

The flow of $C_4F_8$, $CH_4$, and $SiH_4$ during step 102 can alternatively be characterized as flow rates measured in standard cubic centimeters per minute (sccm), per cubic meter of interior volume 22 in PECVD chamber 16. The following are suitable flow rates (per $m^3$ of chamber volume) for carrying out step 102:

3000 to 10,000 sccm of $C_4F_8$ per cubic meter;

300 to 1100 sccm of $CH_4$ per cubic meter; and 100 to 550 sccm of $SiH_4$ per cubic meter.

During the introduction of gases $C_4F_8$, $CH_4$, and $SiH_4$, step 104 is carried out by applying HF and LF plasma energy in chamber 16. The HF energy is at a suggested standard frequency of 13.56 MHz and at an energy level of between 0.5 Watts and 3.0 Watts per square centimeter of surface area 58 of substrate wafer 12. Simultaneously, LF energy is applied at a frequency generally in the range of 100 KHz to 900 KHz at an energy level of between 0.5 Watts and 3.0 Watts per square centimeter of substrate surface.

Steps 102 and 104 deposit a-F:C on wafer 12 (step 108). A suitable thickness of a-F:C film deposited in step 108 is generally in the range of 1,000 angstroms to 10,000 angstroms.

Finally, wafer 12 is removed from chamber 16 by any suitable means, such as handler 30, and annealed (step 110) in a suitable annealing oven at a temperature generally in the range of 300° C. to 550° C. The process exhibits good thermal stability (i.e., shrinkage of less than approximately 1%) at anneal temperatures above 440° C., generally in the range of 440° C.–465° C.

The following is a specific experimental example of the process of the present invention:

EXAMPLE

In an OXFORD Plasma lab 100 PECVD system chamber, a 6-inch wafer 12 was placed on chuck 20 and heated to a temperature of 250° C. A flow of $C_4F_8$, $CH_4$, and $SiH_4$ gases was introduced into the chamber at the following flow rates $C_4F_8$:137 sccm;

$CH_4$:15 sccm; and $SiH_4$:6.1 sccm.

HF power (13.56 MHz) was applied at a power level of 200 Watts and LF power (500 KHz) was applied at 200 Watts. The ambient pressure in the chamber was maintained at approximately 0.4 Torr.

The above conditions produced a deposition rate of a-F:C of 1,200 angstroms/minute. Deposition was carried out for four minutes. Then the wafer was removed from the chamber and a final anneal was carried out at 450° C. for 30 minutes.

The resultant dielectric constant k of the a-F:C was approximately 2.3.

The present invention has been found to improve the thermal stability and lower the dielectric constant of deposited a-F:C films formed by PECVD processes. Variations in the process are possible within the scope of the present invention. For example, the deposition temperature and ratio of gases specified in the experimental example are suggestive only. Within the specified ranges disclosed herein, it will be necessary to optimize the flow rates and temperatures used in IC manufacturing processes which are employed for commercial production.

What is claimed is:

1. A plasma enhanced chemical vapor deposition (PECVD) process for depositing a fluorinated amorphous carbon dielectric material on a substrate for use in interconnect structures of integrated circuits, the method comprising the following steps:

a) position the substrate in a PECVD chamber and heat the substrate to a temperature above 200° C.;

b) introduce a flow of fluorine containing gas (FCG) and carbon containing gas (CCG) into the chamber under sufficient applied energy to form a fluorine and carbon gas plasma, the flow rate ratio of FCG to CCG being selected to deposit fluorinated amorphous carbon containing 40 or more at. % F on the substrate; and c) introduce a flow of $SiH_4$ (silane) into the chamber together with the FCG and CCG in step b) the $SiH_4$ providing H radicals for combining with F atoms to suppress fluorine etchants during fluorinated amorphous carbon deposition, whereby the silane increases the thermal stability of the fluorinated amorphous carbon deposited on the substrate.

2. A PECVD process as in claim 1 in which the substrate is heated to a temperature in the range of about 200° C. to about 300° C. in step a).

3. A PECVD process as in claim 1 in which the FCG introduced in step b) is $C_4F_8$.

4. A PECVD process as in claim 3 in which the CCG introduced in step b) is $CH_4$.

5. A PECVD process as in claim 4 in which the ambient pressure in the PECVD chamber maintained during the introduction of $C_4F_8$, $CH_4$, and silane is in the range of about 0.3 Torr to about 2.0 Torr.

6. A PECVD process as in claim 5 in which the ratio of $C_4F_8$ to $CH_4$ ($C_4F_8/CH_4$) introduced into the PECVD chamber during steps b) and c) is between about 1/1 and about 30/1.

7. A PECVD process as in claim 5 in which the ratio of $C_4F_8$ to $CH_4$ ($C_4F_8/CH_4$) introduced into the PECVD chamber during steps b) and c) is between about 5/1 and about 15/1.

8. A PECVD process as in claim 6 in which the percentage of silane in the $C_4F_8$, $CH_4$, and silane gases introduced into the PECVD chamber in steps b) and c) is in the range of about 1% to about 15%.

9. A PECVD process as in claim 5 in which flow rates of the $C_4F_8$, $CH_4$, and silane gases introduced into the PECVD chamber in steps b) and c), per $cm^3$ of the chamber interior volume, are in the following ranges:

about 3000 to about 10,000 sccm of $C_4F_8$ per $m^3$;
about 300 to about 1100 sccm $CH_4$ per $m^3$; and
about 100 to about 550 sccm of silane per $m^3$.

10. A PECVD process as in claim 1 in which the plasma energy applied in the chamber to form the gas plasma therein includes high-frequency energy at a frequency of 13.56 MHz and an energy level of between 0.5 Watts and 3.0 Watts per square centimeter of substrate surface.

11. A PECVD process as in claim 10 in which the plasma energy applied in the chamber further includes low-frequency energy at a frequency in the range of about 100 KHz to about 900 KHz and energy level of between 0.5 Watts and 3.0 Watts per square centimeter of substrate surface.

12. A PECVD process as in claim 1 including continuing the process until a selected thickness of fluorinated amorphous carbon is deposited on the substrate, and further including the step of annealing the substrate at a temperature in the range of about 300° C. to about 550° C.

13. A plasma enhanced chemical vapor deposition (PECVD) process for depositing fluorinated amorphous carbon dielectric on a substrate for use in interconnect structures of integrated circuits, the method comprising the following steps:

a) position the substrate in a PECVD chamber and heat the substrate to a temperature between 200° C. and 300° C.;

b) introduce octafluorocyclobutane ($C_4F_8$), methane ($CH_4$), and silane ($SiH_4$) into the chamber, wherein the percentage of silane in the introduced gases is in the range of about 1% to about 15%;

c) apply plasma energy in the chamber to form a gas plasma which includes $CF_x$ polymer radicals, wherein x is greater than or equal to 1 and less than or equal to 2, for depositing fluorinated amorphous carbon containing 40 or more at. % fluorine on the substrate; and d) maintain a sufficient flow of octafluorocyclobutane, methane, and silane into the chamber during step b) to provide an interior chamber pressure in the range of about 0.3 Torr to about 2.0 Torr until a selected thickness of the fluorinated amorphous carbon is deposited on the substrate, wherein the silane provides H radicals for combining with F atoms to suppress fluorine etchants during the fluorinated amorphous carbon deposition.

14. A PECVD process as in claim 13 in which the plasma energy applied in the chamber further includes high-frequency energy at a frequency of 13.56 MHz and an energy level of between 0.5 Watts and 3.0 Watts per square centimeter of substrate surface.

15. A PECVD process as in claim 14 in which the plasma energy applied in the chamber further includes low-frequency energy at a frequency in the range of about 100 KHz to about 900 KHz and energy level of between 0.5 Watts and 3.0 Watts per square centimeter of substrate surface.

16. A PECVD process as in claim 13 in which the ratio of octafluorocyclobutane to methane ($C_4F_8/CH_4$) introduced into the PECVD chamber during the process is between about 1/1 and about 30/1.

17. A PECVD process as in claim 16 in which the percentage of silane in the $C_4F_8$, $CH_4$, and silane gases introduced into the PECVD chamber in steps b) and c) is in the range of about 1% to about 15%.

18. A PECVD process as in claim 13 in which the ratio of octafluorocyclobutane to methane ($C_4F_8/CH_4$) introduced into the PECVD chamber during the process is between about 5/1 and about 15/1.

19. A PECVD process as in claim 18 in which the percentage of silane in the $C_4F_8$, $CH_4$, and silane gases introduced into the PECVD chamber in steps b) and c) is in the range of about 1% to about 15%.

20. A PECVD process as in claim 13 including continuing the process until a selected thickness of fluorinated amorphous carbon is deposited on the substrate, and further including the step of annealing the substrate at a temperature greater than or equal to 440° C.

* * * * *